United States Patent [19]

Gulczynski

[11] Patent Number: 4,782,306

[45] Date of Patent: Nov. 1, 1988

[54] POWER AMPLIFIER

[76] Inventor: Zdzislaw Gulczynski, P.O. Box 441, Winchester, Mass. 01890

[21] Appl. No.: 27,561

[22] Filed: Mar. 18, 1987

[51] Int. Cl.$^4$ ............................................. H03F 3/26
[52] U.S. Cl. ................................... 330/262; 330/273
[58] Field of Search ............... 330/252, 255, 261, 262, 330/273, 124 R, 311; 307/490

[56] References Cited

U.S. PATENT DOCUMENTS 4,081,757  3/1978  Rumbaugh ...................... 330/124 R Primary Examiner—Gene Wan

[57] ABSTRACT

The invention relates to an analog power amplifier (PA), particularly for a closed loop signal amplification requiring high output power, high efficiency, extremely high speed, wide operating temperature range and a low number of components. No thermal compensation, no transistor matching and no adjustments are necessary. Any power transistor switching is eliminated including a high efficiency operation with a multiple level power supply.

The input signal of the PA is initially amplified in an input amplifier means which provides a pair of output signals. These signals are separately applied to the bases of a first and third transistors of even conductivity types. The emitter of the first transistor is coupled to the emitter of a second transistor of an opposite conductivity type. The collector, base and emitter respectively of the first, second and third transistors are separately coupled to voltage sources. A fourth transistor coupled in series with the emitter of the third transistor can be employed. The collectors of the second and third transistors have collectors coupled to the output of the PA for providing an output signal thereof.

17 Claims, 3 Drawing Sheets

POWER AMPLIFIER

CROSS REFERENCE TO RELATED APPLICATIONS

This application is related to the application entitled "Operational Amplifier" Ser. No. 027,560, by the same inventor and filed on even date herewith, the content of which is hereby incorporated by reference herein.

BACKGROUND AND SUMMARY OF THE INVENTION

The invention relates to an analog power amplifier (PA), particularly for a closed loop signal amplification requiring high output power, high efficiency, extremely high speed and wide operating temperature range.

Power amplifiers are devices designed to amplify an input signal and provide an undistorted high power output signal, i.e. an alternate current within a wide range of an output voltage; independent of supply voltages, load fluctuations over frequency, operating temperature, etc. The parameters such as input impedance, input offset voltage or open loop gain are not essential.

Conventional PAs comprise single-ended stages which results in a low and asymmetrical slew rate and a slow recovery from clipping. Multiple stages cause cumulative phase shift which impairs the stability. Crossover distortions are minimized by excessive quiescent current causing an extensive power dissipation even with no load. The switching of the power transistors is not completely eliminated however, as each transistor is cut off at a higher output current of the complementary transistor, even worse, a reverse base-emitter voltage is applied thereto.

The output stage with power transistors having emitters or sources coupled is mandatory. This results in a very slow signal amplification, wherein the voltage gain is below one. For instance, the parameter $f_T$ defining the speed of a transistor, being already very poor for power transistors and representing the bandwidth of the PA, is further reduced to a fraction. This also applies to so called transconductance amplifiers which employ a common collector rather common emitter configuration of the power transistors. Low open loop output impedance causes an increased transient intermodulation distortion (TIM) as a too late arriving feedback in response to a fast changing input signal of the PA results in a stiff, uncontrollable load driving.

A thermal compensation, simple in principle, is very inaccurate, unreliable and difficult to accomplish; it demands temperature compensation of at least two complementary high power transistors by means of floating low power components thermally coupled thereto. The quiescent current must be adjusted manually, whereby its stability is very poor. A matching of power transistor is laborious and troublesome, and in case of MOSFETs very difficult to achieve. Furthermore, the temperature coefficient of the MOSFET's gate-source voltage varies in a very wide range and has a zero value at a drain current mostly much higher than a desired quiescent current. Collectors or drains of the transistors, coupled to the cases thereof during a manufacturing process, are on different potentials. Insulating wafers introduce large parasitic capacitances and increase thermal impedance keeping individual devices at more uneven temperature.

The output voltage swing is reduced by the base-emitter or gate-source voltages of the power transistors which can be significant for high output currents and is generally very high for power MOSFETs. In order to improve the stability and accuracy of the quiescent current and minimize the likehood of thermal runaway of the power transistors, power resistors coupled is series with the load are used.

The efficiency is improved by providing a multiple level power supply. The supply voltage of the PA is switched to different values according to the output signal level, usually by means of power switches. The transition must occur at a relatively high voltage across a corresponding power transistor of the amplifier in order to prevent its saturation. The instant voltage switching at a high output current puts an enormous stress on the power transistors designed for a signal amplification, and degrades their long-term reliability.

The invention is intended to solve the above problems and therefore the object of the invention is to provide a PA having high output power, high efficiency, extremely high speed, wide operating temperature range and a very low number of components. According to the invention a PA with push-pull stages, power transistors coupled for fastest possible signal amplification and a bias circuit completely eliminating switching of the power transistors solves these problems. Moreover, a very high efficiency can be easily obtained thru an employment of multiple PAs, one of which can be greatly simplified, and a nonlinear amplifier which completely eliminates controllable power switches.

A PA according to the present invention includes an input amplifier means for amplifying the input signal of the PA and providing a first and second output signals, a first and second transistors of a first and second conductivity types respectively each having a base, emitter and collector, wherein the emitters are coupled together and the base of the first transistor is coupled to receive the first output signal of the input amplifier means, a third transistor of the first conductivity type having a first and second electrodes and also having a collector coupled to the collector of the second transistor for providing an output signal of the PA, a means for applying the second output signal of the input amplifier means to the first electrode of the third transistor, a first, second and third voltage sources, a first means for coupling the first voltage source to the collector of the first transistor, a second means for coupling the second voltage source to the base of the second transistor, and a third means for coupling the third voltage source to the second electrode of the third transistor.

In another embodiment PA includes a nonlinear amplifier means for amplifying an input signal of the PA and providing a plurality of interim signals, and power amplifier means for separately amplifying each of the interim signals and for combining the amplified interim signals into a single output signal of the PA.

BRIEF DESCRIPTION OF THE DRAWINGS

The present invention will become more clear in conjunction with the accompanying figures of which.

Throughout the drawings, similar references denote similar parts.

DETAILED DESCRIPTION OF THE INVENTION

Figure 1:
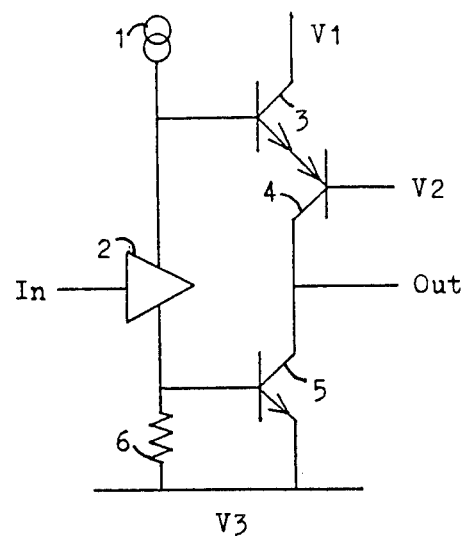
FIG. 1 is a basic structure of the embodiment.

FIG. 1 is a basic structure of the embodiment. The input signal is applied to the input In of the input amplifier means consisting of the amplifier 2 and a pair of biasing means. The biasing means are the current source 1 and the resistor 6 coupled to the supply voltage source V3, and are employed to adequately bias the outputs of the amplifier 2 and output transistors coupled thereto. The amplifier 2 amplifies the input signal of the PA and provides a pair of output signals. Generally, these signals are received by the biasing means further providing responsive signals to the output transistors. No connection of the current source 1 to voltage source V1 is shown as the purpose of a current source is to provide a current regardless of the supply voltage, i.e. this can be any voltage.

The output signals of the input amplifier means are separately applied to the bases of the npn transistors 3 and 5. The collector of the transistor 3, the base of the transistor 4 and the emitter of the transistor 5 are coupled to the voltage sources V1, V2 and V3 respectively. The emitters of the transistors 3 and 4 are coupled together. The transistors 4 and 5 are of opposite conductivity types and have collectors coupled to the output of the PA for providing an output signal thereof.

The choice of the common base configuration of the transistor 4, determined by the connection of its base to the fixed voltage sources V2, is very significant. First of all, this is the fastest possible configuration which also has a highest voltage gain. The collectors of the transistors 4 and 5 can be tied together. Moreover, this configuration provides for an approximately constant and very low collector-emitter voltage of the transistor 3 so that a relatively low power device can be used, yet being capable of conducting a full output current of the PA.

Figure 2:
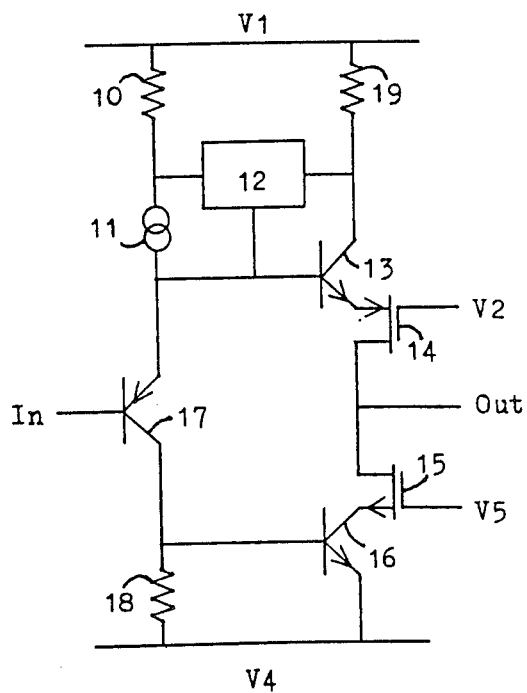
FIG. 2 is the preferred embodiment of the PA.

FIG. 2 is the preferred embodiment of the PA. The input amplifier means consists of the pnp transistor 17 and a pair of biasing means. The input In of the PA is the base of the transistor 17. The emitter thereof is coupled to the base of the npn transistor 13 and a biasing means which is the current source 11. The collector of the transistor 17 is coupled to the base of the npn transistor 16 and another biasing means which is the resistor 18, further coupled to the supply voltage source V4. The emitter and collector of the transistor 17 can be exchanged and its conductivity type altered. The emitter of the npn transistor 13 is coupled to the source of the p-Ch MOSFET 14, similarly to 3 and 4 of FIG. 1.

The PA comprises a means for applying one of the output signals of the input amplifier means to the n-Ch MOSFET 15. This means simply includes the transistor 16 having collector and emitter coupled respectively to the source of the transistor 15 and the supply voltage source V4. The function of the voltage source V5 is similar to V3 of FIG. 1, i.e. providing a reference to a transistor whose collector or drain is coupled to the output of the PA. However, the voltage sources V1, V3 and V4 are capable to provide high power output signals. The common gate configuration of the MOSFETs 14 and 15 implicates similar advantages as the transistor 4 of FIG. 1. The PA further comprises the resistor 19 coupled between the supply voltage source V1 and the collector of the transistor 13 for conducting a collector current thereof. It also comprises a sensing amplifier means exhibiting an offset voltage and being coupled to the resistor 19. This means includes the differential amplifier means 12 having a pair of inputs and an output, for providing an output current according to a voltage applied to the inputs thereof. The voltage across the resistor 10, being coupled in series with the resistor 19 and conducting the current of the current source 11, is a reference and is considered as the offset voltage of the sensing amplifier means.

The differential amplifier means 12 establishes a negative feedback by determining a portion of the transistor 13 base current. The means 12 provides a higher source output current if the voltage across the resistor 19 is smaller than across the resistor 10. Otherwise, this current is equal zero. The voltage across the resistor 19 is therefore always greater than zero and so is the collector/drain current of the transistors 13 and 14, independent of the output voltage and current of the PA.

As the differential amplifier means 12 an ordinary differential amplifier can be used, e.g. consisting of a pair of pnp transistors with emitters coupled to a resistor or current source. The bases of the transistors provide a pair of inputs and the collector the transistor with the base coupled to the resistor 10 provides an output. Similarly, an operational amplifier having an open collector output can be employed. Its inverting and noninverting inputs can be coupled to the resistors 10 and 19 respectively. Furthermore, the resistor 19 can be bridged by a diode limiting the voltage thereacross.

The maximum output current of the differential amplifier means 12 must be greater than the sum of a maximum base current of the transistor 16 and a current supplied to the resistor 18, reduced by the current of the current source 11. Furthermore, the current of the current source 11 has a higher value than the maximum base current of the transistor 13 so that the voltage across the resistors 18 is always greater than zero. This may result in collector/drain currents of the transistors 15 and 16 always greater than zero.

The collector/drain current of the transistors 13 thru 16 flowing at the output current, and possibly output voltage, of the PA equal zero is called quiescent current. An operational amplifier coupled to the input of the PA will set a balance under close loop condition, by determining the base voltage and collector current of the transistor 17. The quiescent current depends on the current of the current source 11 and the values of the resistors 10 and 19. For instance, if the resistor values are equal, the quiescent current is equal to the current of the current source 11.

No thermal compensation, no transistor matching and no adjustments are necessary.

Figure 3:
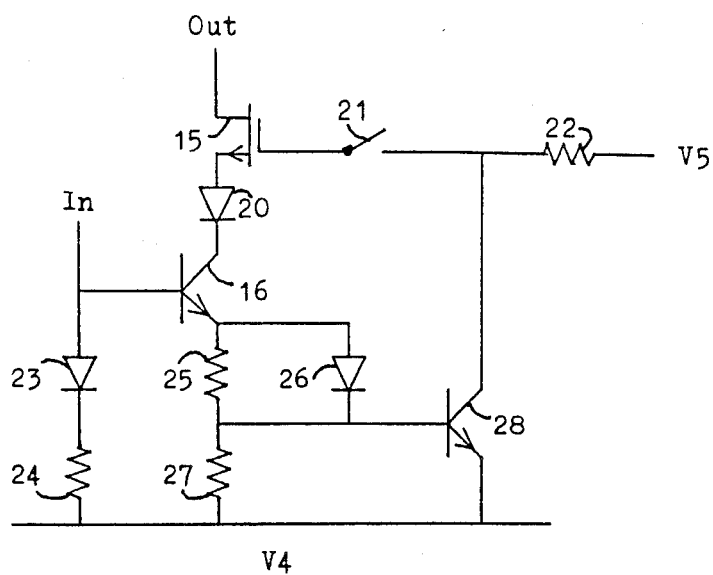
FIG. 3 is a part of the FIG. 2 embodiment, including a short circuit protection and implementing an operation with a multilevel power supply.

FIG. 3 is a part of the FIG. 2 embodiment including a respective biasing means, the transistor 15, a means for applying a signal to the source thereof and means for coupling the gate thereof to the voltage source V5. Furthermore, the embodiment includes a short circuit protection, implements an operation with a multilevel power supply and improves the stability of the minimal collector/drain current of the transistors 15 and 16.

The diode 20 makes possible an operation with a multilevel power supply described hereinbelow with reference to FIG. 4. It is connected in series with the source of the transistor 15 for preventing reverse polarity currents therein and in corresponding components. The switch 21, e.g. comprising an ordinary transistor, coupled in series with the gate of the transistor 15 is used for a further protection. The diode 20 can be coupled anywhere in the collector-emitter (more specific drain-emitter) path of the transistors 15 and 16, to conduct a collector/drain current thereof. For instance, it can be connected in series with the drain of the transistor 15, whereby a reverse gate current protection is established and the switch 21 superfluous. However, the drain is then no longer directly connected to the output of the PA.

The stability of the minimal collector/drain current of the transistors 15 and 16 due to changes of temperature, output current of the PA, etc., can be improved. The biasing means comprises the diode 23 and resistor 24 coupled in series. The resistor 25 is coupled between the emitter of the transistor 16 and the supply voltage source V4. The resistor 25 can have a higher value for a higher accuracy as the optional diode 26 is coupled in parallel for limiting a voltage drop thereacross. The voltage across the resistor 24 determines the voltage across the resistor 25 and thus the minimal collector/drain current of the transistors 15 and 16. The base-emitter voltage of the transistor 16 is compensated by the diode 23 which further improves the stability.

The short circuit protection can be accomplished by sensing the excessive collector/drain current of the transistors 15 and 16. A resistor coupled anywhere in the collector-emitter path thereof can be used. The resistor 27 of a small value, coupled to the emitter of the transistor 16 via the resistor 25 is shown. The base and emitter of the transistor 28 is coupled to the resistor 27. A too high output current of the PA flowing thru the transistors 15 and 16 increases the collector current of the transistor 28 which further intends to cut off the transistor 15 by means of reducing its gate voltage. The collector of the transistor 28 is coupled to the gate of the transistor 15 and to the voltage source V5 via the resistor 22. The transistor 28 can also control the switch 21 which makes the resistor 22 obsolete.

The connection of the resistor 27 to the supply voltage source V4 is preferred as it allows a more accurate short circuit current. An amplifier sensing the excessive voltage across the resistor 27, and having an open collector output coupled to the gate of the transistor 15, can be easily implemented. A reference voltage of the amplifier can be controlled by the output voltage of the PA, e.g. by means of a resistor divider, thus precisely determining the operation of the transistor 15 within its safe operating area (SOA). It shall be also pointed out that the described short circuit protection does not access the input amplifier means. An ordinary protection would reduce the base voltage of the transistor 16.

The hereinabove described short circuit and reverse current protections can be also analogously applied to the transistors 13 and 14 of FIG. 2, whereas their minimal collector/drain current is already stabilized by the sensing amplifier means.

Figure 4:
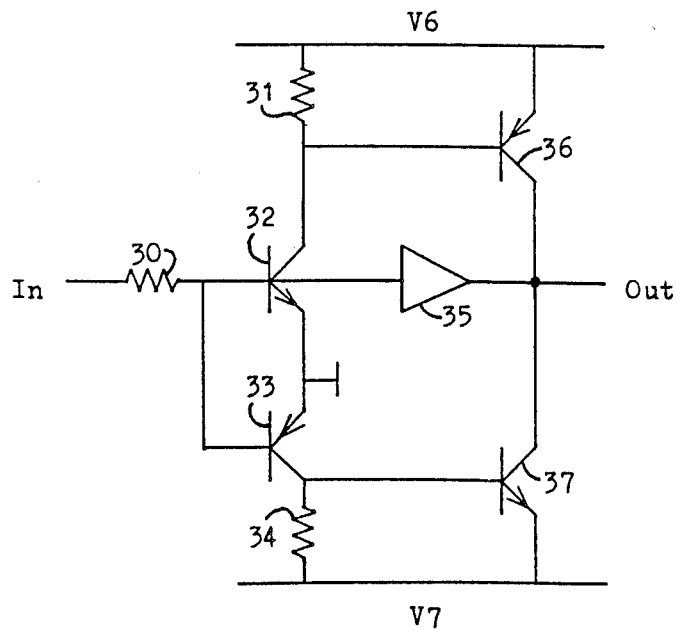
FIG. 4 is a high efficiency PA.

FIG. 4 is a high efficiency PA comprising a multilevel power supply. The circuit also contains a nonlinear amplifier and a pair of PAs, one of which is greatly simplified as it consists of just two transistors, whereby each transistor can be considered as a separate PA. The nonlinear amplifier amplifies the input signal of the PA and provides a plurality of interim signals, further separately amplified by the PAs. The outputs thereof are coupled together for combining the amplified interim signals into a single output signal of the PA.

The input signal of the PA is applied to the nonlinear amplifier which comprises the resistors 30, 31 and 34, and the transistors 32 (npn) and 33 (pnp). The emitters thereof are connected to ground. The bases thereof are tied to the resistor 30, and the collectors thereof are coupled to the supply voltage sources V6 and V7 via the resistors 31 and 34 respectively, and provide a pair of outputs of the nonlinear amplifier. The input and a third output thereof are the separate ends of the resistor 30. The collectors of the transistors 32 and 33 are connected to the bases of the transistors 36 (pnp) and 37 (npn) respectively. The emitters of the transistors 36 and 37 are coupled to the respective supply voltage sources V6 and V7 which extend the output voltage range of the entire circuit.

At a threshold voltage, approximately equal to the base-emitter voltage of the transistor 32 or 33, an increasing input signal results in a greatly increasing collector current of one of the transistors 32 or 33, and only slightly increasing input voltage of the PA 35. The collectors of the transistors 36 and 37 are coupled together for providing the output signal for higher output voltages. Thus, voltages outside the supply voltage range of the PA 35 are applied to the output thereof. A necessary protection circuit may simply consist of diodes, each coupled in series with an output transistor of the PA 35, such as the diode 20 of FIG. 3. As the PA 35 the embodiment of FIG. 2 with an added input stage can be used.

The linearity of the transfer function can be improved by matching the gains of the PA 35 and the remaining PA. The technique of nested loops can be employed. An operational amplifier can be used as an input stage of the PA 35 for setting its gain to an accurate value. Similarly, a plurality of PAs can be used, each having separate supply voltages and an output coupled to the output of the entire circuit. A nonlinear amplifier having a single input and plurality of outputs can control the transfer of the input signal to separate PAs so that each receives a smaller or bigger part of the input signal according to the level thereof. It shall be pointed out that only one PA requires a short circuit protection.

Figure 5:
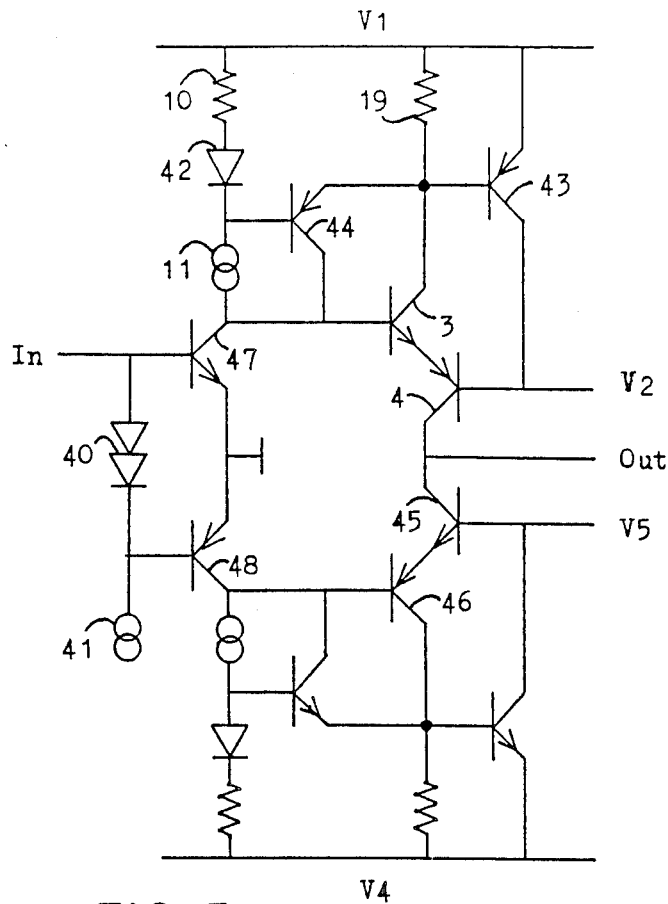
FIG. 5 is another embodiment of the PA.

FIG. 5 is another embodiment of the PA. For simplicity, only a part of the circuit is described hereinbelow due to its symmetrical operation and configuration, as clearly shown. The input signal of the PA is applied to the input amplifier means essentially comprising a pair of the complementary transistors 47 (npn) and 48 (pnp) and, as biasing means, a pair of current sources. The emitters of the transistors 47 and 48 are coupled to ground. The bases thereof, with one providing the input In, are tied together via the dual diode 40.

The diode 40 and the current source 41 set the quiescent current of the transistors 47 and 48. Resistors, each coupled in series with the diode 40 and the emitters of the transistors 47 and 48, can be added for a greater stability of the current. The quiescent current of the PA essentially depends on the values of the resistors 10 and 19, the current of the current source 11 and the quiescent current of the transistors 47 and 48.

The transistors 3 and 4 are coupled as in FIG. 1 and correspond to the transistors 13 and 14 of FIG. 2. The sensing amplifier means includes the pnp transistor 44 used as a differential amplifier means. The offset voltage of the sensing amplifier means is set by the resistor 10 conducting the current of the current source 11. The quiescent current of the PA is also determined by the resistor 19 coupled between the supply voltage source V1 and the collector of the transistor 3. The pair of inputs and an output of the differential amplifier means are respectively the base, emitter and collector of the transistor 44. The base and emitter of the transistor 43 are coupled across the resistor 19. An excessive output current of the PA flowing thru the transistors 3 and 4 increases the collector current of the transistor 4 which further intends to cut off the transistor 4 by means of reducing its base voltage. An internal impedance of the voltage source V2 coupled thereto is assumed.

The transistor 44 establishes a negative feedback. It provides a greater collector current if the voltage drop across the resistor 10 is greater than across resistor 19. A reference means provides the base voltage of the transistor 44 wherein its base-emitter voltage is compensated by the conducting diode 42 coupled in series with the resistor 10. The voltage drop across the resistor 19 further determines the collector current sum of the transistors 3 and 44, and is chosen in such a manner that the collector currents of the transistors 3 and 4 are always greater than zero, independent of the output voltage and current of the PA.

A thermal compensation can be easily accomplished as it applies to low power devices only, such as the diode 42 and transistor 44, the diode 40 and transistors 47 and 48. The second part of the PA comprises analogous components. Specifically, the conductivity types of the transistors 3 and 46 are opposite, similarly to the transistors 4 and 45.

Figure 6:
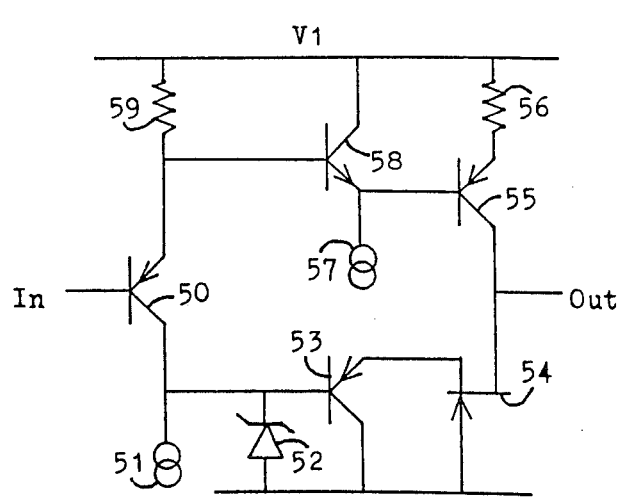
FIG. 6 is an embodiment of a simplified PA.

FIG. 6 is the embodiment of a simplified PA. An example of an application is an output stage of an operational amplifier. The PA has an inherent short circuit protection. The input signal of the PA is applied to the input amplifier means comprising the pnp transistor 50 and a pair of biasing means.

One biasing means comprises a voltage follower and the resistor 59 coupled between the emitter of the transistors 50 and the supply voltage source V1. The voltage follower comprises the npn transistor 58 and the current source 57. The emitter voltage of the transistor 50 is applied to the base of the pnp transistor 55. The voltages across the resistors 59 and 56 are approximately equal as the base-emitter voltages of the transistors 58 and 55 cancel each other out. The emitter of the transistor 55 is coupled to the supply voltage source via the resistor 56.

The other biasing means comprises the current source 51 coupled to the Zener diode 52 and the collector and base of the transistors 50 and 53 respectively. The diode 52 is also coupled to the supply voltage source V3 and allows the collector current of the transistor 50 to be greater than current of the current source 51. Generally, the diode 52 is on and off respectively for positive and negative output voltages of the PA. The emitter of the pnp transistor 53 and the source of the n-Ch JFET 54 are tied together, and the collector and gate thereof are coupled to the supply voltage source V3. The drain and collector of the transistors 54 and 55 respectively, are coupled together for providing an output signal of the PA.

The embodiments of the present invention described herein are intended to be taken in an illustrative and not a limiting sense. Various modifications and changes may be made to these embodiments by persons skilled in the art without departing from the scope of the present invention as defined in the appended claims.

What I claim is:

1. Power amplifier, comprising:

an input amplifier means for amplifying the input signal of the power amplifier and providing a first and second output signals;

a first and second transistors of a first and second conductivity types respectively each having a base, emitter and collector, wherein the emitters are coupled together and the base of the first transistor is coupled to receive the first output signal of the input amplifier means;

a third transistor of the first conductivity type having a first and second electrodes and also having a collector coupled to the collector of the second transistor for providing an output signal of the power amplifier;

a means for applying the second output signal of the input amplifier means to the first electrode of the third transistor;

a first, second and third voltage sources;

a first means for coupling the first voltage source to the collector of the first transistor;

a second means for coupling the second voltage source to the base of the second transistor; and a third means for coupling the third voltage source to the second electrode of the third transistor.

2. Power amplifier of claim 1 wherein the first and second electrodes of the third transistor are a base and emitter respectively.

3. Power amplifier of claim 1 wherein one of the electrodes of the third transistor is an emitter and further including a first resistive means coupled in series therewith.

4. Power amplifier of claim 1 wherein the first and second electrodes of the third transistor are an emitter and base respectively, wherein the means for applying includes a fourth transistor having a base coupled to receive the second output signal of the input amplifier means, a first electrode coupled to the emitter of the third transistor, and a second electrode, further including a fourth voltage source and a fourth means for coupling the fourth voltage source to the second electrode of the fourth transistor.

5. Power amplifier of claim 4 wherein the fourth transistor is of the first conductivity type and the first and second electrodes thereof are a collector and emitter respectively.

6. Power amplifier of claim 4 wherein the fourth transistor is of the second conductivity type and the first and second electrodes thereof are an emitter and collector respectively.

7. Power amplifier of claim 6 wherein the fourth means for coupling includes a second resistive means and a second amplifier means exhibiting an offset voltage and being coupled to the second resistive means for sensing a voltage thereacross and accordingly providing a signal to the base of the fourth transistor.

8. Power amplifier of claim 7 wherein the second amplifier means includes a fifth transistor of the first conductivity type having a collector and emitter coupled respectively to the base and collector of the fourth transistor, and a base, further including a first reference means coupled to the base of the fifth transistor for determining the offset voltage of the second amplifier means.

9. Power amplifier of claim 4 further including first means for sensing an excessive current in one of the electrodes of the fourth transistor and for controlling a current in the third transistor in response thereto.

10. Power amplifier of claim 9 wherein the first means for sensing and controlling includes a third resistive means coupled in series with one of the electrodes of the fourth transistor to conduct a current thereof, and a third amplifier means coupled to sense an excessive voltage across the third resistive means for providing a signal to the third means for coupling in response thereto.

11. Power amplifier of claim 1 wherein the first means for coupling includes a fourth resistive means and a fourth amplifier means exhibiting an offset voltage and being coupled to the fourth resistive means for sensing a voltage thereacross and accordingly providing a signal to the base of the first transistor.

12. Power amplifier of claim 11 wherein the fourth amplifier means includes a sixth transistor of the second conductivity type having a collector and emitter coupled respectively to the base and collector of the first transistor, and a base, further including a second reference means coupled to the base of the sixth transistor for determining the offset voltage of the fourth amplifier means.

13. Power amplifier of claim 1 further including second means for sensing an excessive current in the collector or emitter of the first transistor and for controlling a current in the second transistor in response thereto.

14. Power amplifier of claim 13 wherein the second means for sensing and controlling includes a fifth resistive means coupled in series with the collector or emitter of the first transistor to conduct a current thereof, and a fifth amplifier means coupled to sense an excessive voltage across the fifth resistive means for providing a signal to the second means for coupling in response thereto.

15. Power amplifier of claim 1 further including at least one diode means coupled in series with the collector or emitter of the second and/or third transistor for preventing reverse polarity currents therein.

16. Power amplifier of claim 1 wherein means for applying includes means for compensating for the voltage between the first and second electrodes of the third transistor.

17. Power amplifier of claim 1 wherein the input amplifier means further includes current source means for biasing at least the first transistor.

* * * * *